United States Patent
Bader et al.

(10) Patent No.: US 6,212,963 B1
(45) Date of Patent: Apr. 10, 2001

(54) PIEZO-TRANSDUCER AND CABLING CONFIGURATION

(75) Inventors: Christopherus Bader, Neftenbach; Paul Engeler, Frauenfeld, both of (CH)

(73) Assignee: K.K. Holding AG, Winterhur (CH)

( * ) Notice: Subject to any disclaimer, the term of this patent is extended or adjusted under 35 U.S.C. 154(b) by 0 days.

(21) Appl. No.: 09/168,965

(22) Filed: Oct. 9, 1998

(30) Foreign Application Priority Data

Oct. 13, 1997 (CH) .................................................. 2385/97

(51) Int. Cl.[7] ................................................. G01M 19/00
(52) U.S. Cl. ........................... 73/865.9; 73/862.541; 73/756; 73/866.1
(58) Field of Search .................... 73/866.5, 756, 73/866.1, 865.9, 862.541, 862.68, 754, 753

(56) References Cited

U.S. PATENT DOCUMENTS

| | | | |
|---|---|---|---|
| 3,852,667 | * 12/1974 | Williams et al. | 324/72 |
| 3,993,860 | * 11/1976 | Snow et al. | 174/69 |
| 4,146,875 | * 3/1979 | Beatson et al. | 73/720 X |
| 4,763,078 | * 8/1988 | Williams | 324/458 |
| 4,868,566 | * 9/1989 | Strobel et al. | 340/870.3 |
| 4,928,051 | * 5/1990 | Williams | 324/458 X |
| 4,975,800 | * 12/1990 | Oshita et al. | 324/520 X |
| 5,427,516 | * 6/1995 | Bader et al. | 425/149 |

* cited by examiner

Primary Examiner—Thomas P. Noland
(74) Attorney, Agent, or Firm—Barnes & Thornburg

(57) ABSTRACT

A production mold with piezo-transducers and associated signal processing amplifiers located inside it are housed in a tightly sealed, electrically shielded unit. The piezo-transducers are linked by a stranded conductor only insulated, which is cut to length in situ and led inside the shielded unit to a high-insulating terminal of the amplifier. There is no longer any need to use shielded cables between the piezo-transducer and amplifier.

9 Claims, 2 Drawing Sheets

A - A

PIEZO-TRANSDUCER AND CABLING CONFIGURATION

BACKGROUND AND SUMMARY OF THE INVENTION

The invention relates to a simplification of the cabling for piezoelectric transducers of which one are more are fitted in closed systems and directly connected to electronic amplifying and switching devices.

Taking as an example an injection mould for plastics, sintered materials and light metals, the installation advantages of the invention will be shown, though it can be used for many other applications also. For the mass production of high-precision parts it is becoming increasingly necessary to fit transducers in complex production tools, in order to keep the reject rates down to a defined level.

In the so-called multicavity injection moulds up to 50 very accurate small parts can be produced in a injection cycle. Accordingly the mould is equipped with 50 piezo pressure transducers, all with different cable lengths and all connected to the signal processing in an amplifier box mounted on the actual mould. From this amplifier box, a collective cable then leads to the control and monitoring cabinet of the machine. The piezo-transducers generate highly sensitive charge signals, which are converted in the amplifier into strong voltage signals that can be led dependably to the control cabinet even in an environment with much electromagnetic interference. In general therefore, piezoelectric transducers use shielded cables having graphite interlayers to reduce electromagnetic and electrical disturbances. A disadvantage of such cables is that they can be made up into given lengths in situ only at the expense of much trouble. Another difficulty is that standard terminal blocks as generally used for normally insulated measuring lines cannot be employed with shielded cables.

The invention is intended to overcome these disadvantages when installing piezoelectric transducers and to simplify fitting them so that and connected reliably to normal terminal blocks. For this, the cables must be led completely inside the mould, so that interference fields are screened off automatically. The discovery that a piezoelectric connecting cable may be used inside a metal mould shielding is a part of the invention that was confirmed only after extensive testing. It became possible only with the availability of high-insulating terminal blocks, constituting a novelty and bringing significant simplifications to installation. Exploiting this discovery further, a transition bushing has been developed that can be fitted to the mould instead of a single terminal, enabling connection from the transducer at one end with the same unshielded cable to a normal shielded cable from outside the mould.

Other objects, advantages and novel features of the present invention will become apparent from the following detailed description of the invention when considered in conjunction with the accompanying drawings.

DETAILED DESCRIPTION OF THE PREFERRED EMBODIMENTS

Figure 1:
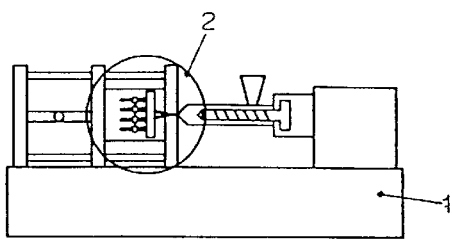
FIG. 1 Schematic of a injection moulding machine.

The machine foundation 1 in FIG. 1 is the common support for all machine components, including also the multicavity mould 2.

Figure 2:
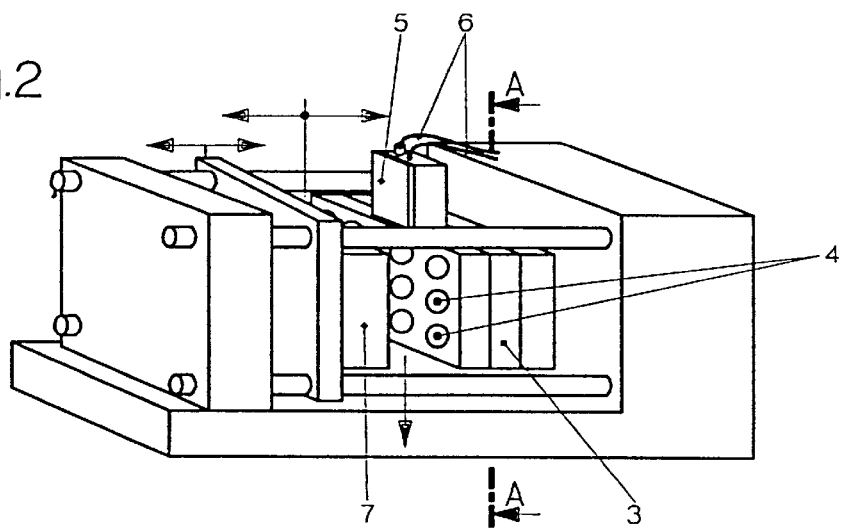
FIG. 2 Machine mould block of FIG. 1.

FIG. 2 shows the entire block resting on the machine foundation 1. The block includes a fixed mould block or production tool 3 and an amplifier box or housing 5 screwed tight onto the mould block 3 and accommodating all cable connect ions of the individual piezo-transducers. The mould block 3 and amplifier box 5 form an electronically shielded metal unit. The signals converted into measuring voltages are led via the control cable 6 to the control cabinet of the machine (not shown). The mould 7 in which the mouldings take shape is movable, to enable the mouldings to be ejected after the injection shot and dropped into the container below.

Figure 3:
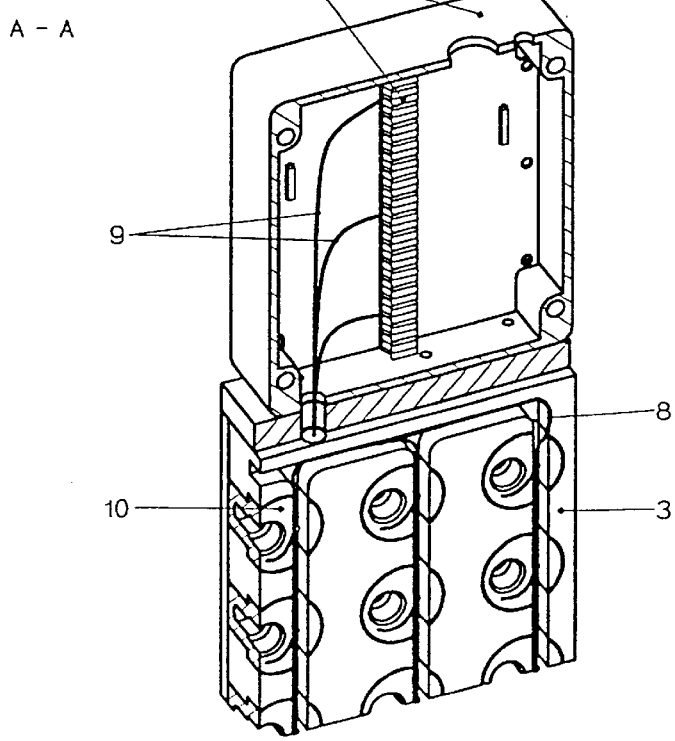
FIG. 3 Section A—A in FIG. 2 showing the opened amplifier box with individual cable connections mounted on the mould box.

FIG. 3 shows the section A—A of FIG. 2 through the amplifier box 5 and part of the mould block 3. In the mould block 3 a number of multicavity inserts 10 are shown, with the necessary cable configuration 8 led through a sealed opening in the amplifier box 5. Fitted in the amplifier box 5 are high-insulating terminal blocks 11, into which the cables 9 are introduced after shortening to the proper length without further treatment and connected conductively simply by clamping.

The assembling procedure is new for piezo-cables, because terminal blocks 11 reaching insulation values of at least $10^{13}\Omega$ even with 50% humidity in the mould block became available only recently.

Figure 4:
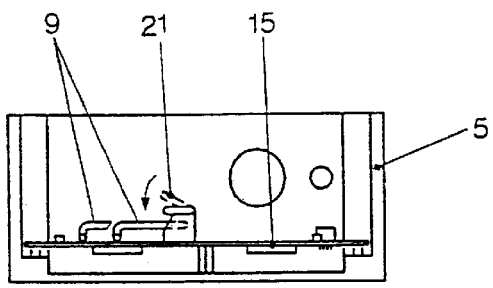
FIG. 4 Cross section through the amplifier box in FIG. 3.

FIG. 4 shows the section through the amplifier box 5 in which the terminal blocks 11 are mounted on the amplifier printed circuit board. The connected amplifiers 15 of the individual measuring channels are indicated only schematically. After leading the cables 9 into the opened terminal block 11, the cable 9 can be connected electrically and secured mechanically by depressing th e terminal lever 21.

Figure 5:
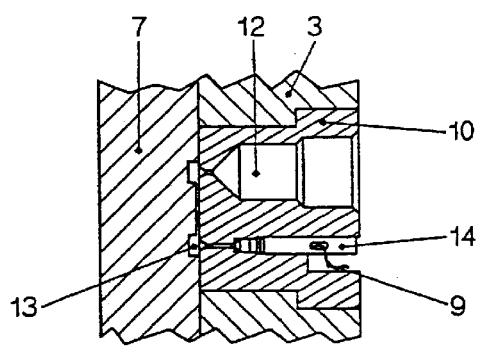
FIG. 5 Detail of the multicavity mould block.

FIG. 5 shows a detail from the mould block 3. The multicavity insert 10 has an injection channel 12 and a permanently mounted piezo-pressure transducer 14. The cavity for the moulding 13 is machined into the injection mould 7.

Figure 6:
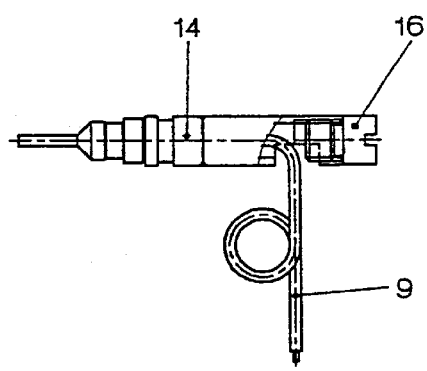
FIG. 6 Piezo-transducer fitted in FIG. 5 with standard-length connecting cable.

FIG. 6 shows an enlargement of the piezo-pressure transducer 14 in FIG. 5, with the integrated cable 9 supplied with the transducer in a standard length of typically 1 meter, which is shortened to the requisite length when installing. The screw 16 serves to compensate any length tolerances when fitting, so that the transducer is held in the cover plate of the mould block 3.

Figure 7:
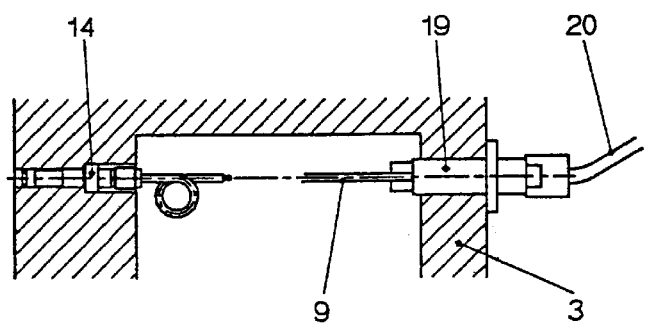
FIG. 7 Alternative individual measuring channel with inbuilt socket.

FIG. 7 shows a variant with single-channel configuration, where the mould block 3 is sealed tightly by a special cable bushing 19 forming part of the invention, which accepts the cable 9 on one side and leads into a normal shielded cable 20 on the other side.

Figure 8:
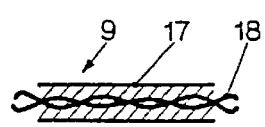
FIG. 8 Longitudinal section through stranded conductor 9.

FIG. 8 shows a cross-section of the cable, which comprises copper litz wires sheathed in a polyimide or insulating material, preferably TEFLON® or KAPTON®.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A cabling configuration for piezoelectric transducers in monitoring systems on production machines, comprising:
   a production tool and an electronic amplifier housing forming a tightly sealed electrically shielded unit;
   a piezoelectric transducer in the production tool; and
   an insulated stranded conductor extending from the transducer in the tool to a terminal of an amplifier in the amplifier housing so that it is surrounded on all sides by the shielded unit.

2. A cabling configuration according to claim 1, wherein the transducer is fitted with an integrated and insulated stranded conductor of surplus length, the stranded conductor is led into the tool to the terminal where it is cut to length, introduced into the terminal and secured.

3. A cabling configuration according to claim 1 wherein the terminal is plastic with an insulation value of at least $10^{13}$ Ω at 50% humidity.

4. A cabling configuration according to claim 3, wherein the stranded conductor is sheathed with polytetrafluoroethylene.

5. A cabling configuration according to claim 3, wherein the stranded conductor is sheathed with a heat-resistant polyimid.

6. A cabling configuration according to claim 1, further comprising a second transducer, and a bushing fitted tightly in the production tool, the bushing receiving the stranded conductor of the second transducer and joining it outside the shielded unit to a shielded cable.

7. A cabling configuration according to claim 1, wherein the stranded conductor is sheathed with polytetrafluoroethylene.

8. A cabling configuration according to claim 1, wherein the stranded conductor is sheathed with a heat-resistant polyimid.

9. A cabling configuration for piezoelectric transducers in monitoring systems on production machines, comprising:
   a production tool and a housing forming a tightly sealed electrically shielded unit;
   a piezoelectric transducer in the production tool; and
   an insulated stranded conductor extending from the transducer to a bushing, which receives the stranded conductor in the housing so that it is surrounded on all sides by the shielded unit, the bushing fitted tightly within the production tool and connecting the stranded conductor to a shielded cable which extends outside of the shielded unit.

* * * * *